(12) United States Patent
Mathijssen et al.

(10) Patent No.: US 10,656,533 B2
(45) Date of Patent: May 19, 2020

(54) METROLOGY IN LITHOGRAPHIC PROCESSES

(71) Applicant: ASML Netherlands B.V., Veldhoven (NL)

(72) Inventors: Simon Gijsbert Josephus Mathijssen, Rosmalen (NL); Martin Jacobus Johan Jak, 's-Hertogenbosch (NL); Kaustuve Bhattacharyya, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/106,322

(22) Filed: Aug. 21, 2018

(65) Prior Publication Data
US 2019/0079413 A1    Mar. 14, 2019

(30) Foreign Application Priority Data

Sep. 11, 2017 (EP) .................................... 17190401
Sep. 27, 2017 (EP) .................................... 17193415

(51) Int. Cl.
*G03F 7/20* (2006.01)
*G01N 21/47* (2006.01)

(52) U.S. Cl.
CPC ..... *G03F 7/70633* (2013.01); *G01N 21/4788* (2013.01); *G03F 7/7015* (2013.01);
(Continued)

(58) Field of Classification Search
CPC ..... G01N 35/00732; G01N 2035/0441; G01N 21/00; G03F 7/0002; G03F 7/70775;
(Continued)

(56) References Cited

U.S. PATENT DOCUMENTS

| 5,229,872 A | 7/1993 | Mumola |
| 5,296,891 A | 3/1994 | Vogt et al. |

(Continued)

FOREIGN PATENT DOCUMENTS

| EP | 1628164 A2 | 2/2006 |
| WO | WO 99/49504 A1 | 9/1999 |

(Continued)

OTHER PUBLICATIONS

International Search Report and Written Opinion of the International Searching Authority directed to related International Patent Application No. PCT/EP2018/071069, dated Nov. 7, 2018; 11 pages.

*Primary Examiner* — Mesfin T Asfaw
(74) *Attorney, Agent, or Firm* — Sterne, Kessler, Goldstein & Fox P.L.L.C.

(57) ABSTRACT

An apparatus and method for estimating a parameter of a lithographic process and an apparatus and method for determining a relationship between a measure of quality of an estimate of a parameter of a lithographic process are provided. In the apparatus for estimating the parameter a processor is configured to determine a quality of the estimate of the parameter relating to the tested substrate based on a measure of feature asymmetry in the at least first features of the tested substrate and further based on a relationship determined for a plurality of corresponding at least first features of at least one further substrate representative of the tested substrate, the relationship being between a measure of quality of an estimate of the parameter relating to the at least one further substrate and a measure of feature asymmetry in the corresponding first features.

19 Claims, 10 Drawing Sheets

(52) U.S. Cl.
CPC ........ *G03F 7/7065* (2013.01); *G03F 7/70283* (2013.01); *G03F 7/70625* (2013.01)

(58) Field of Classification Search
CPC .......... G03F 9/7088; G03F 1/22; G03F 7/094; G03F 7/095; G03F 7/20; G03F 7/2002; G03F 7/2006; G03F 7/70608; G03F 7/70625; G03F 7/70633; G03F 9/70; G03F 9/7084
See application file for complete search history.

(56) References Cited

U.S. PATENT DOCUMENTS

| | | |
|---|---|---|
| 5,523,193 A | 6/1996 | Nelson |
| 6,952,253 B2 | 10/2005 | Lof et al. |
| 7,701,577 B2 | 4/2010 | Straaijer et al. |
| 7,791,724 B2 | 9/2010 | Den Boef et al. |
| 8,115,926 B2 | 2/2012 | Straaijer |
| 8,553,227 B2 | 10/2013 | Jordanoska |
| 8,681,312 B2 | 3/2014 | Straaijer |
| 8,692,994 B2 | 4/2014 | Straaijer |
| 8,792,096 B2 | 7/2014 | Straaijer |
| 8,797,554 B2 | 8/2014 | Straaijer |
| 8,823,922 B2 | 9/2014 | Den Boef |
| 2007/0229837 A1 | 10/2007 | Schaar et al. |
| 2010/0328655 A1 | 12/2010 | Den Boef |
| 2011/0026032 A1 | 2/2011 | Den Boef et al. |
| 2011/0027704 A1 | 2/2011 | Cramer et al. |
| 2011/0043791 A1 | 2/2011 | Smilde et al. |
| 2011/0102753 A1 | 5/2011 | Van De Kerkhof et al. |
| 2011/0249244 A1 | 10/2011 | Leewis et al. |
| 2012/0044470 A1 | 2/2012 | Smilde et al. |
| 2012/0123581 A1 | 5/2012 | Smilde et al. |
| 2013/0162996 A1 | 6/2013 | Straaijer et al. |
| 2014/0060148 A1* | 3/2014 | Amit .................... G01B 21/042 73/1.79 |
| 2016/0161863 A1 | 6/2016 | Den Boef et al. |
| 2016/0161864 A1* | 6/2016 | Middlebrooks ..... G03F 7/70633 355/67 |
| 2016/0313658 A1 | 10/2016 | Marciano et al. |
| 2016/0370717 A1 | 12/2016 | Den Boef et al. |

FOREIGN PATENT DOCUMENTS

| | | |
|---|---|---|
| WO | WO 2009/078708 A1 | 6/2009 |
| WO | WO 2009/106279 A1 | 9/2009 |
| WO | WO 2011/012624 A1 | 2/2011 |
| WO | WO 2015/018625 A1 | 2/2015 |

* cited by examiner

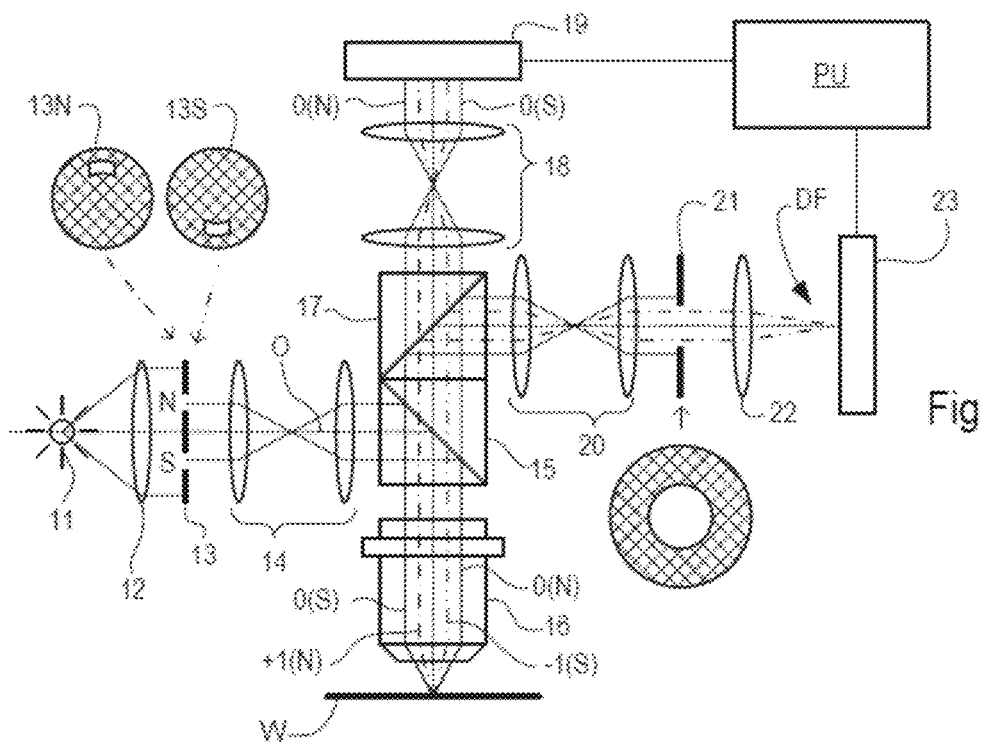
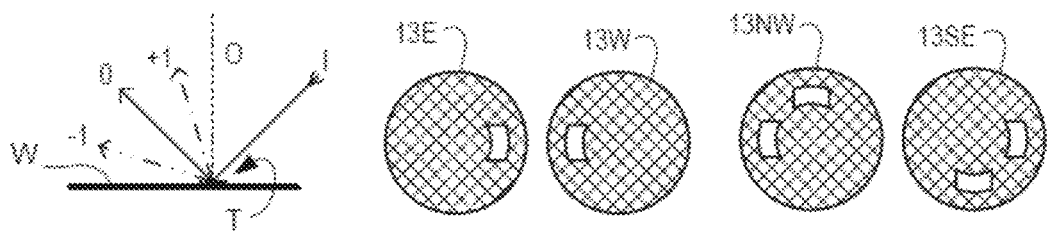
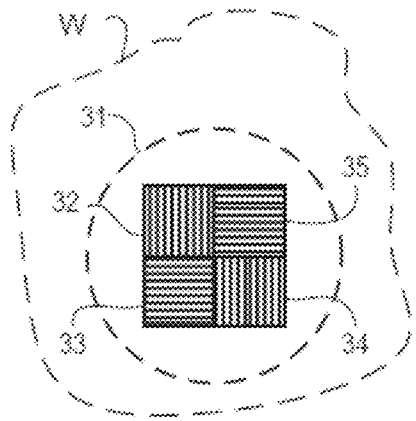
Fig. 4
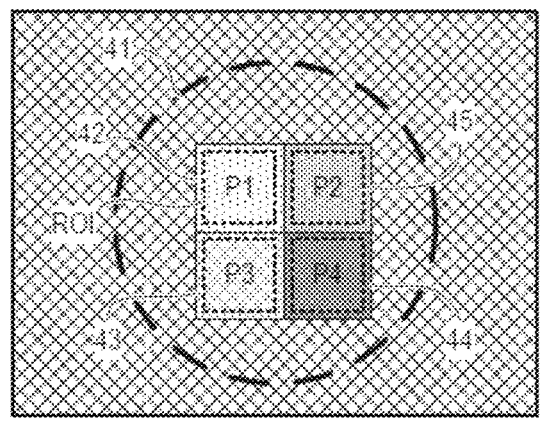
Fig. 5

METROLOGY IN LITHOGRAPHIC PROCESSES

TECHNICAL FIELD

The invention relates to methods and apparatus for estimating a parameter of a lithographic process and, in particular, determining a quality of such an estimation. In particular arrangements, the parameter may be overlay.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

In lithographic processes, it is desirable frequently to make measurements of parameters of the structures created. One such parameter is overlay, which is a measure of the accuracy with which two or more layers of the structures have been fabricated, with respect to each other. One technique for measurement of overlay is to plot asymmetry intensity data for a first feature having a positive overlay bias against asymmetry intensity data for a second feature having a negative overlay bias, and then to determine a gradient of a line fit through that data. This technique may be termed asymmetry intensity regression analysis. This process is explained in greater detail below.

However, the quality of the asymmetry intensity data is affected by one or more further parameters, such as asymmetry in the first and/or second features themselves. It is desirable to determine a quality of the estimate of the overlay measurement such that they may be accepted, rejected or otherwise weighted during metrology methods.

SUMMARY

Methods and apparatus disclosed herein are aimed at solving or mitigating one or more problems associated with the prior art, including those discussed or derivable from this document. In particular, methods and apparatus disclosed may seek to solve the problem of determining a quality of a measurement of a parameter, such as overlay.

Further, the inventors have appreciated that determination of quality of an overlay measurement for a specific wafer may be time consuming and unsuitable for high volume manufacture of semiconductor devices. Therefore, the inventors have established that it is desirable to have methods and apparatus for determining quality of parameters such as overlay without introducing a high time burden on lithographic processes.

According to the invention in an aspect, there is provided an apparatus for estimating a parameter of a lithographic process that has been undertaken on a tested substrate, the estimation being based on regression analysis data that has been determined by a regression analysis of asymmetry intensity data that has, in turn, been determined using radiation emitted by an optical system at one or more wavelengths and diffracted by at least first features of the tested substrate, the apparatus comprising: a processor configured to determine a quality of the estimate of the parameter relating to the tested substrate based on a measure of feature asymmetry in the at least first features of the tested substrate and further based on a relationship determined for a plurality of corresponding at least first features of at least one further substrate representative of the tested substrate, the relationship being between a measure of quality of an estimate of the parameter relating to the at least one further substrate and a measure of feature asymmetry in the corresponding first features.

The relationship allows determination of an accuracy of an overlay estimate base on only a fewer measurements of asymmetry intensity.

Optionally, the estimation is based on radiation emitted by the optical system at a plurality of wavelengths.

Optionally, the emitted radiation is diffracted by the first features and by second features, the first feature having a positive overlay bias and the second feature having a negative overlay bias.

Optionally, the relationship is determined for a plurality of pairs of corresponding first and second features on the at least one further substrate.

Optionally, the measure of feature asymmetry comprises an intercepter of the regression analysis data.

Optionally, the measure of quality of the estimate of the parameter for the at least one further substrate comprises a goodness of fit of corresponding regression analysis data for the at least one further substrate.

Optionally, the corresponding regression analysis for the further substrate has been determined using radiation emitted and diffracted from the plurality of corresponding at least first features of the at least one further substrate at a number of wavelengths greater than the one or more wavelengths emitted by the optical system.

Optionally, the processor is further configured to disregard the estimate of the parameter on the tested substrate if a magnitude of the measure of feature asymmetry in the at least first features of the tested substrate exceeds a threshold value that is based on the relationship determined for the corresponding at least first features of at least one further substrate.

Optionally, the at least first features form part of a metrology target.

Optionally, the optical system is configured to emit radiation at wavelengths in ranges from: 400 nm to 900 nm; 0.1 nm to 100 nm; and/or 10 nm to 20 nm.

Optionally, the processor is further configured, based on radiation emitted by the optical system at three or more wavelengths and diffracted from the plurality of corresponding at least first features of the further substrate, to: determine further substrate asymmetry intensity data for the plurality of corresponding at least first features relating to the further substrate; based on the determined further substrate asymmetry intensity data, determine the measure of quality of the estimate of the parameter relating to the at least one further substrate and the measure of feature asymmetry relating to the further substrate; and determine the relationship between the measure of quality of the estimate of the parameter relating to the at least one further substrate and the measure of feature asymmetry in the plurality of corresponding at least first features.

Optionally, the processor is further configured to determine the measure of quality of the estimate of the parameter relating to the at least one further substrate by undertaking a regression analysis on the further substrate asymmetry intensity data.

Optionally, the measure of quality of the estimate of the parameter relating to the at least one further substrate comprises a goodness of fit of the regression analysis.

Optionally, wherein the processor is further configured to determine the measure of feature asymmetry in the plurality of corresponding at least first features based on the determined further substrate asymmetry intensity data.

Optionally, the measure of feature asymmetry in the plurality of corresponding at least first features comprises an intercept term of the regression analysis.

Optionally, the apparatus further comprises one or more of: the optical system; and a sensor configured to sense the diffracted radiation.

Optionally, the parameter of the lithographic process comprises overlay.

According to an aspect of the invention, there is provided an apparatus for determining a relationship between a measure of quality of an estimate of a parameter of a lithographic process and a measure of feature asymmetry in a plurality of at least first features of at least one example substrate, based on radiation emitted by an optical system at one or more wavelengths and diffracted from the plurality of at least first features of the example substrate, the apparatus comprising a processor configured to: determine asymmetry intensity data for the plurality of at least first features relating to the at least one example substrate based on the diffracted radiation; based on the determined asymmetry intensity data, determine the measure of quality of the estimate of the parameter relating to the at least one example substrate and the measure of feature asymmetry relating to the further substrate; and determine the relationship between the measure of quality of the estimate of the parameter relating to the at least one example substrate and the measure of feature asymmetry in the plurality of at least first features.

According to an aspect of the invention, there is provided an inspection apparatus comprising any apparatus described herein.

Optionally, the inspection apparatus is a metrology apparatus.

According to an aspect of the invention, there is provided a lithographic apparatus comprising any apparatus described herein.

According to an aspect of the invention, there is provided a lithographic cell comprising any apparatus described herein.

According to an aspect of the invention, there is provided a method for estimating a parameter of a lithographic process that has been undertaken on a tested substrate, the estimation being based on regression analysis data that has been determined by a regression analysis of asymmetry intensity data that has, in turn, been determined using radiation emitted by an optical system at one or more wavelengths and diffracted by at least first features of the tested substrate, the method comprising: determining a quality of the estimate of the parameter relating to the tested substrate based on a measure of feature asymmetry in the at least first features of the tested substrate and further based on a relationship determined for a plurality of corresponding at least first features of at least one further substrate representative of the tested substrate, the relationship being between a measure of quality of an estimate of the parameter relating to the at least one further substrate and a measure of feature asymmetry in the corresponding first features.

Optionally, the estimation is based on radiation emitted by the optical system at a plurality of wavelengths.

Optionally, the emitted radiation is diffracted by the first features and by second features, the first feature having a positive overlay bias and the second feature having a negative overlay bias.

Optionally, the relationship is determined for a plurality of pairs of corresponding first and second features on the at least one further substrate.

Optionally, the measure of feature asymmetry comprises an intercept term of the regression analysis data.

Optionally, wherein the measure of quality of the estimate of the parameter for the at least one further substrate comprises a goodness of fit of corresponding regression analysis data for the at least one further substrate.

Optionally, the corresponding regression analysis for the further substrate has been determined using radiation emitted and diffracted from the plurality of corresponding at least first features of the at least one further substrate at a number of wavelengths greater than the one or more wavelengths emitted by the optical system.

Optionally, the method further comprises disregarding the estimate of the parameter on the tested substrate if a magnitude of the measure of feature asymmetry in the at least first features of the tested substrate exceeds a threshold value that is based on the relationship determined for the corresponding at least first features of at least one further substrate.

Optionally, the at least first features form part of a metrology target.

Optionally, the optical system is configured to emit radiation at wavelengths in ranges from: 400 nm to 900 nm; 0.1 nm to 100 nm; and/or 10 nm to 20 nm.

Optionally, the method further comprises, based on radiation emitted by the optical system at three or more wavelengths and diffracted from the plurality of corresponding at least first features of the further substrate: determining further substrate asymmetry intensity data for the plurality of corresponding at least first features relating to the further substrate; based on the determined further substrate asymmetry intensity data, determining the measure of quality of the estimate of the parameter relating to the at least one further substrate and the measure of feature asymmetry relating to the further substrate; and determining the relationship between the measure of quality of the estimate of the parameter relating to the at least one further substrate and the measure of feature asymmetry in the plurality of corresponding at least first features.

Optionally, the method further comprises determining the measure of quality of the estimate of the parameter relating to the at least one further substrate by undertaking a regression analysis on the further substrate asymmetry intensity data.

Optionally, the measure of quality of the estimate of the parameter relating to the at least one further substrate comprises a goodness of fit of the regression analysis.

Optionally, the method further comprises determining the measure of feature asymmetry in the plurality of corresponding at least first features based on the determined further substrate asymmetry intensity data.

Optionally, the measure of feature asymmetry in the plurality of corresponding at least first features comprises an intercept term of the regression analysis.

Optionally, the parameter of the lithographic process comprises overlay.

According to an aspect of the invention, there is provided a method for determining a relationship between a measure of quality of an estimate of a parameter of a lithographic process and a measure of feature asymmetry in a plurality of at least first features of at least one example substrate, based on radiation emitted by an optical system at one or more wavelengths and diffracted from the plurality of at least first features of the example substrate, the method comprising: determining asymmetry intensity data fur the plurality of at least first features relating to the at least one example substrate based on the diffracted radiation; based on the determined asymmetry intensity data, determining the measure of quality of the estimate of the parameter relating to the at least one example substrate and the measure of feature asymmetry relating to the further substrate; and determining the relationship between the measure of quality of the estimate of the parameter relating to the at least one example substrate and the measure of feature asymmetry in the plurality of at least first features.

According to an aspect of the invention, there is provided a computer program comprising instructions which, when executed on at least one processor, cause the at least one processor to control an apparatus to carry out any method disclosed herein. According to an aspect of the invention, there is provided a carrier containing the computer program above, wherein the carrier is one of an electronic signal, optical signal, radio signal, or non-transitory computer readable storage medium.

BRIEF DESCRIPTION OF THE DRAWINGS

Exemplary embodiments are described herein with reference to the accompanying drawings, in which:

FIG. 3a shows a schematic representation of a scatterometer;

FIG. 3b shows a target and associated diffracted radiation rays;

FIGS. 3c and 3d show pairs of apertures for use with the overlay apparatus of FIG. 3a;

FIG. 4 shows a schematic representation of a form of multiple grating target and an outline of a measurement spot on a substrate;

FIG. 5 shows a schematic representation of an image of the target of FIG. 4 obtained in the scatterometer of FIG. 3;

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:
  a programmable mirror array. More information on such mirror arrays is given in U.S. Pat. Nos. 5,296,891 and 5,523,193, which are incorporated herein by reference.
  a programmable LCD array. An example of such a construction is given in U.S. Pat. No. 5,229,872, which is incorporated herein by reference.

Figure 1:
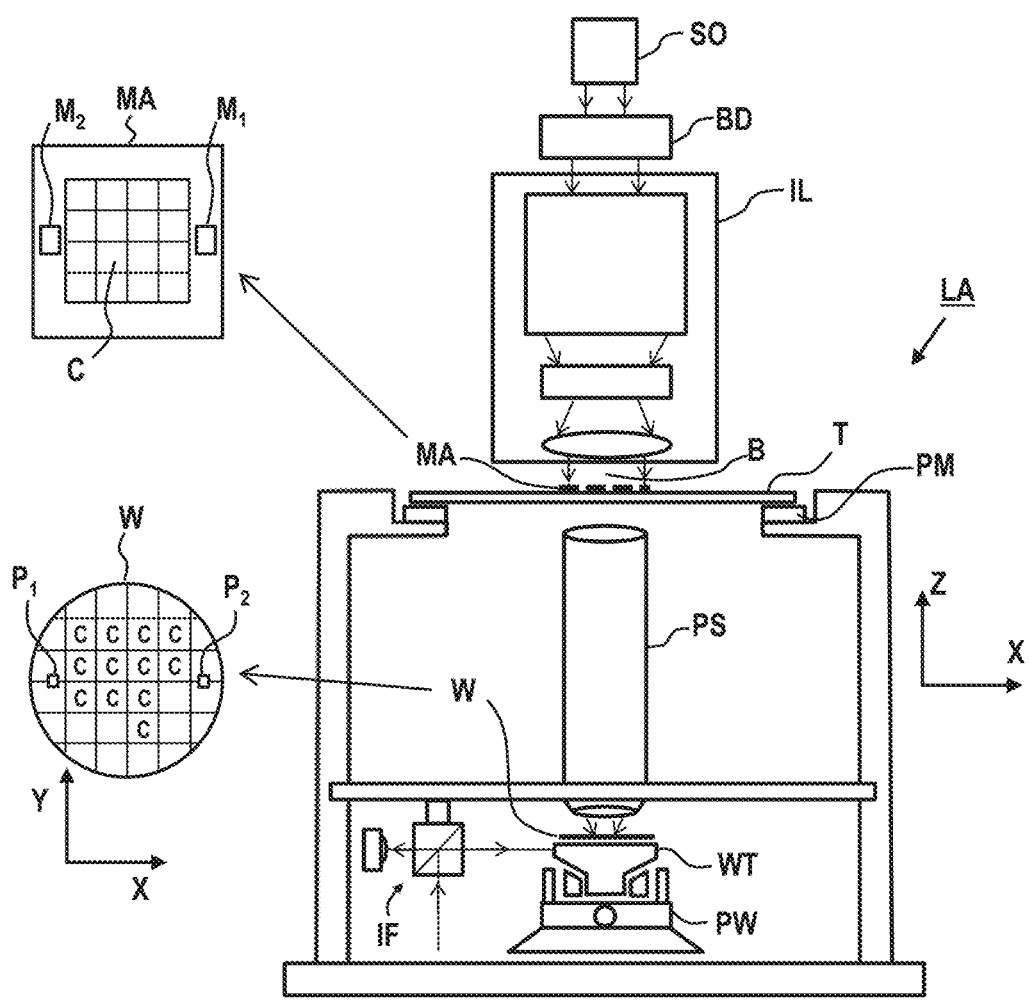
FIG. 1 is a schematic representation of a lithographic apparatus.

FIG. 1 schematically depicts a lithographic apparatus LA. The lithographic apparatus LA includes an illumination system (also referred to as illuminator or optical system) IL configured to condition a radiation beam B (e.g., UV radiation, DUV radiation or EUV radiation), a support structure (e.g., a mask table) T constructed to support a patterning device (e.g., a mask) MA and connected to a first positioner PM configured to accurately position the patterning device MA in accordance with certain parameters, a substrate table (e.g., a wafer table) WT constructed to hold a substrate (e.g., a resist coated wafer) W and connected to a second positioner PW configured to accurately position the substrate in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illuminator IL receives a radiation beam from a radiation source SO, e.g., via a beam delivery system BD. The illumination system IL may include various types of optical components, such as refractive, reflective, magnetic, electromagnetic, electrostatic, or other types of optical components, or any combination thereof, for directing, shaping, or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and electrostatic optical systems, or any combination thereof as appropriate for the exposure radiation being used, or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system and the substrate—which is also referred to as immersion lithography. More information on immersion techniques is given in U.S. Pat. No. 6,952,253 and in PCT publication No. WO99-49504, which are incorporated herein by reference.

The lithographic apparatus LA may also be of a type having two (dual stage) or more substrate tables WT and, for example, two or more support structure T (not shown). In such "multiple stage" machines the additional tables/structures may be used in parallel, or preparatory steps may be carried out on one or more tables while one or more other tables are being used for exposing the design layout of the patterning device MA onto the substrate W.

In operation, the radiation beam B is incident on the patterning device (e.g., mask MA), which is held on the support structure (e.g., mask table T), and is patterned by the patterning device MA. Having traversed the mask MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and possibly another position sensor (which is not explicitly depicted in FIG. 1) may be used to accurately position the mask MA with respect to the path of the radiation beam B. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks).

Figure 2A:
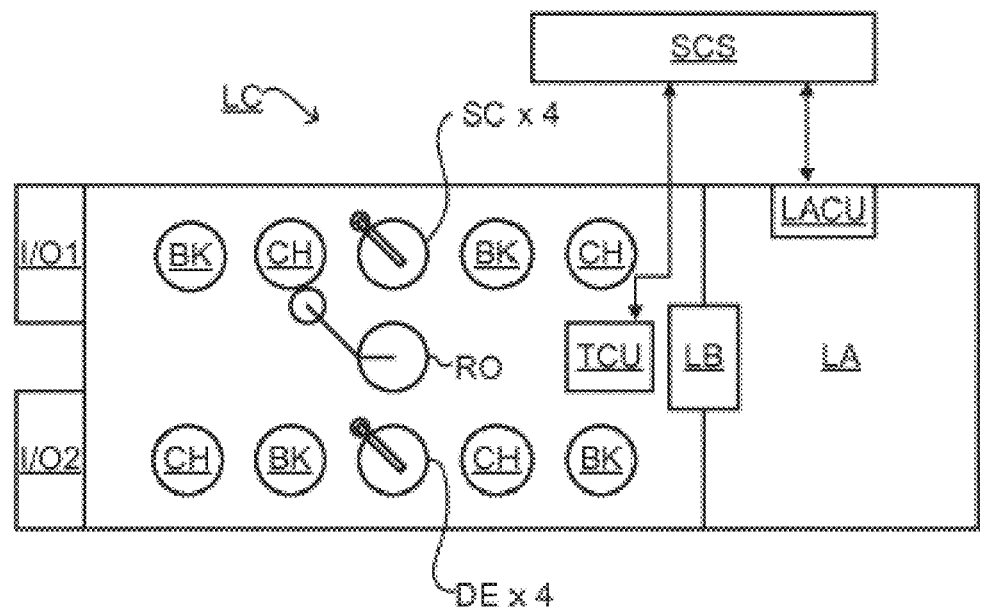
FIG. 2a is a schematic representation of a lithographic cell or cluster.

As shown in FIG. 2a the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RC) picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties or parameters of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 2B:
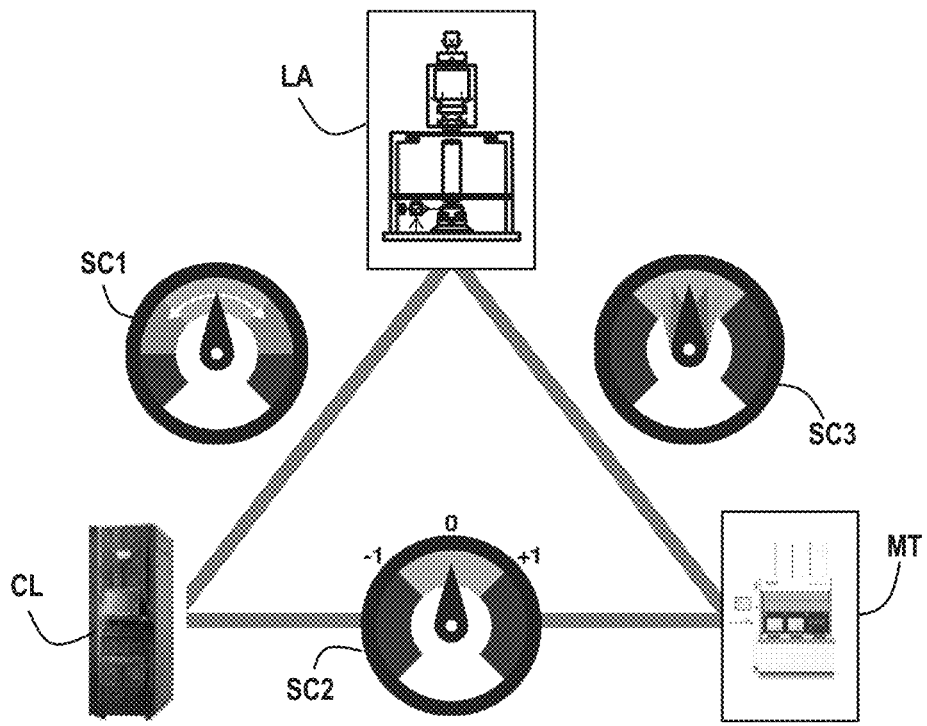
FIG. 2b is a schematic representation of a holistic control environment for a lithographic process.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 2b. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 2b by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 2b by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 2b by the multiple arrows in the third scale SC3).

In lithographic processes, it is desirable to make frequent measurements of the structures created, e.g., for process control and verification. Tools to make such measurement are typically called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure gratings using radiation from soft x-ray radiation, extreme ultraviolet radiation, visible light to near-IR wavelength range.

In a one arrangement, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a further arrangement, the scatterometer MT is a spectroscopic scatterometer MT. In such a spectroscopic scatterometer MT, the radiation emitted by a radiation source is directed onto the target and the reflected or scattered radiation from the target is directed to a spectrometer detector, which measures a spectrum a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a further arrangement, the scatterometer MT is a ellipsometric scatterometer. The ellipsometric scatterometer allows for determining parameters of a lithographic process by measuring scattered radiation for each of a plurality of polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920, 968, 12/922,587, 13/000,229, 13/033,135, 13/533,110 and 13/891,410 incorporated herein by reference in their entirety.

The scatterometer MT may be adapted to measure the overlay of two misaligned gratings or periodic structures by measuring asymmetry in the reflected spectrum and/or the detection configuration, the asymmetry being related to the extent of the overlay. The two (typically overlapping) grating structures may be applied in two different layers (not necessarily consecutive layers), and may be formed substantially at the same position on the wafer. The scatterometer may have a symmetrical detection configuration as described e.g. in co-owned patent application EP1,628, 164A, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO2011/012624 or US patent application US 20160161863, incorporated herein by reference in their entirety.

Other parameters of interest may be focus and dose. Focus and dose may be determined simultaneously by scatterometry (or alternatively by scanning electron microscopy) as described in US patent application US2011-0249244, incorporated herein by reference in its entirety. A single structure may be used which has a unique combination of critical dimension and sidewall angle measurements for each point in a focus energy matrix OEM also referred to as Focus Exposure Matrix). If these unique combinations of critical dimension and sidewall angle are available, the focus and dose values may be uniquely determined from these measurements.

A metrology target may be an ensemble of composite gratings, formed by a lithographic process, mostly in resist, but also after etch process for example. Typically the pitch and line-width of the structures in the gratings strongly depend on the measurement optics (in particular the NA of the optics) to be able to capture diffraction orders coming from the metrology targets. As indicated earlier, the diffracted signal may be used to determine shifts between two layers (also referred to as 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation which are configured to mimic dimensions of the functional part of the design layout in a target. Due to this sub-segmentation, the targets will behave more similar to the functional part of the design layout such that the overall process parameter measurements resembles the functional part of the design layout better. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016-0161863 and not yet published U.S. patent application Ser. No. 15/181,126, incorporated herein by reference in its entirety.

A micro diffraction based overlay (µDBO) metrology apparatus suitable for use in exemplary methods and apparatus disclosed herein of the invention is shown in FIG. 3(*a*). A target grating T and diffracted rays are illustrated in more detail in FIG. 3(*b*). The µDBO metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses may be arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 3(*b*), target grating T is placed with substrate W normal to the optical axis O of objective lens 16. A ray of illumination I impinging on grating T from an angle off the axis O gives rise to a zeroth order ray (solid line 0) and two first order rays (dot-chain line +1 and double dot-chain line −1). It should be remembered that with an overfilled small target grating, these rays are just one of many parallel rays covering the area of the substrate including metrology target grating T and other features. Since the aperture in plate 13 has a finite width (necessary to admit a useful quantity of light), the incident rays I will in fact occupy a range of angles, and the diffracted rays 0 and +1/−1 will be spread out. According to the point spread function of a small target, each order +1 and −1 will be further spread over a range of angles, not a single ideal ray as shown. Note that the grating pitches and illumination angles can be designed or adjusted so that the first order rays entering the objective lens are closely aligned with the central optical axis. The rays illustrated in FIGS. 3(*a*) and 3(*b*) are shown off axis, purely to enable them to be more easily distinguished in the diagram.

At least the 0 and +1 orders diffracted by the target on substrate W are collected by objective lens 16 and directed back through beam splitter 15. Returning to FIG. 3(*a*), both the first and second illumination modes are illustrated, by designating diametrically opposite apertures labeled as north (N) and south (S). When the incident ray I is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction, which are not the subject of the present disclosure.

In the second measurement branch, optical system 20, 22 forms an image of the target of the substrate W on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to a processor, such as an image processor, and controller PU, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 3 are purely examples. In other exemplary apparatus, on-axis illumination of the targets is used and an aperture stop with an off-axis aperture is used to pass substantially only one first order of diffracted light to the sensor. In yet other exemplary apparatus, 2nd, 3rd and higher order beams (not shown in FIG. 3(*b*)) can be used in measurements, instead of or in addition to the first order beams.

In order to make the illumination adaptable to these different types of measurement, the aperture plate 13 may comprise a number of aperture patterns formed around a disc, which rotates to bring a desired pattern into place. Alternatively or in addition, a set of plates 13 could be provided and swapped, to achieve the same effect. A programmable illumination device such as a deformable mirror array or transmissive spatial sight modulator can be used also. Moving mirrors or prisms can be used as another way to adjust the illumination mode.

As just explained in relation to aperture plate 13, the selection of diffraction orders for imaging can alternatively be achieved by altering the pupil-stop 21, or by substituting a pupil-stop having a different pattern, or by replacing the fixed field stop with a programmable spatial light modulator. In that case the illumination side of the measurement optical system can remain constant, while it is the imaging side that has first and second modes. In the present disclosure, therefore, there are effectively three types of measurement methods, each with its own advantages and disadvantages. In one method, the illumination mode is changed to measure the different orders. In another method, the imaging mode is changed. In a third method, the illumination and imaging modes remain unchanged, but the target is rotated through 180 degrees. In each case the desired effect is the same, namely to select first and second portions of the non-zero order diffracted radiation which are symmetrically opposite one another in the diffraction spectrum of the target. In principle, the desired selection of orders could be obtained by a combination of changing the illumination modes and the imaging modes simultaneously, but that is likely to bring disadvantages for no advantage, so it will not be discussed further.

While the optical system used for imaging in the present examples has a wide entrance pupil which is restricted by the field stop 21, in other arrangements or applications the entrance pupil size of the imaging system itself may be small enough to restrict to the desired order, and thus serve also as the field stop. Different aperture plates are shown in FIGS. 3(c) and (d) which can be used as described further below.

Typically, a target grating will be aligned with its grating lines running either north-south or east-west. That is to say, a grating will be aligned in the X direction or the Y direction of the substrate W. Note that aperture plate 13N or 13S can only be used to measure gratings oriented in one direction (X or Y depending on the set-up). For measurement of an orthogonal grating, rotation of the target through 90° and 270° might be implemented. More conveniently, however, illumination from east or west is provided in the illumination optics, using the aperture plate 13E or 13W, shown in FIG. 3(c). The aperture plates 13N to 13W can be separately formed and interchanged, or they may be a single aperture plate which can be rotated by 90, 180 or 270 degrees. As mentioned already, the off-axis apertures illustrated in FIG. 3(c) could be provided in field stop 21 instead of in illumination aperture plate 13. In that case, the illumination would be on axis.

FIG. 3(d) shows a third pair of aperture plates that can be used to combine the illumination modes of the first and second pairs. Aperture plate 13NW has apertures at north and east, while aperture plate 13SE has apertures at south and west. Provided that cross-talk between these different diffraction signals is not too great, measurements of both X and Y gratings can be performed without changing the illumination mode.

FIG. 4 depicts a composite target formed on a substrate according to known practice. The composite target comprises four gratings 32 to 35 positioned closely together so that they will all be within a measurement spot 31 formed by the illumination beam of the metrology apparatus. The four targets thus are all simultaneously illuminated and simultaneously imaged on sensors 19 and 23. In an example dedicated to overlay measurement, gratings 32 to 35 are themselves composite gratings formed by overlying gratings that are patterned in different layers of the semi-conductor device formed on substrate W. Gratings 32 to 35 may have different overlay biases in order to facilitate measurement of overlay between the layers in which the different parts of the composite gratings are formed. As used herein, the term "overlay bias" encompasses an intentionally imparted overlay and any overlay error will be in addition to the bias. Gratings 32 to 35 may also differ in their orientation, as shown, so as to diffract incoming radiation in X and Y directions. In one example, gratings 32 and 34 are X-direction gratings with overlay biases of +d, −d, respectively. This means that grating 32 has its overlying components arranged so that if they were both printed exactly at their nominal locations one of the components would be offset relative to the other by a distance d. Grating 34 has its components arranged so that if perfectly printed there would be an offset of d but in the opposite direction to the first grating and so on. Gratings 33 and 35 are Y-direction gratings with offsets +d and −d respectively. While four gratings are illustrated, another embodiment might require a larger matrix to obtain the desired accuracy. For example, a 3×3 array of nine composite gratings may have biases −4d, −3d, −2d, −d, 0, +d, +2d, +3d, +4d. Separate images of these gratings can be identified in the image captured by sensor 23.

FIG. 5 shows an example of an image that may be formed on and detected by the sensor 23, using the target of FIG. 4 in the apparatus of FIG. 3, using the aperture plates 13NW or 13SE from FIG. 3D). While the pupil plane image sensor 19 cannot resolve the different individual gratings 32 to 35, the image sensor 23 can do so. The dark rectangle represents the field of the image on the sensor, within which the illuminated spot 31 on the substrate is imaged into a corresponding circular area 41. Within this, rectangular areas 42-45 represent the images of the small target gratings 32 to 35. If the gratings are located in product areas, product features may also be visible in the periphery of this image field. Image processor and controller PU processes these images using pattern recognition to identify the separate images 42 to 45 of gratings 32 to 35. In this way, the images do not have to be aligned very precisely at a specific location within the sensor frame, which greatly improves throughput of the measuring apparatus as a whole. However the need for accurate alignment remains if the imaging process is subject to non-uniformities across the image field. In one embodiment of the invention, four positions P1 to P4 are identified and the gratings are aligned as much as possible with these known positions.

Once the separate images of the gratings have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an important example of such a parameter, and is a measure of the lateral alignment of two lithographic layers. Overlay can be defined more specifically, for example, as the lateral position difference between the center of the top of a bottom grating and the center of the bottom of a corresponding top-grating.

Examples of dark field metrology can be found in international patent applications WO 2009/078708 and WO 2009/106279 which documents are hereby incorporated by reference in their entirety. Further developments of the technique have been described in patent publications US20110027704A, US20110043791A and US20120123581. The contents of all these applications are also incorporated herein by reference.

Figure 6:
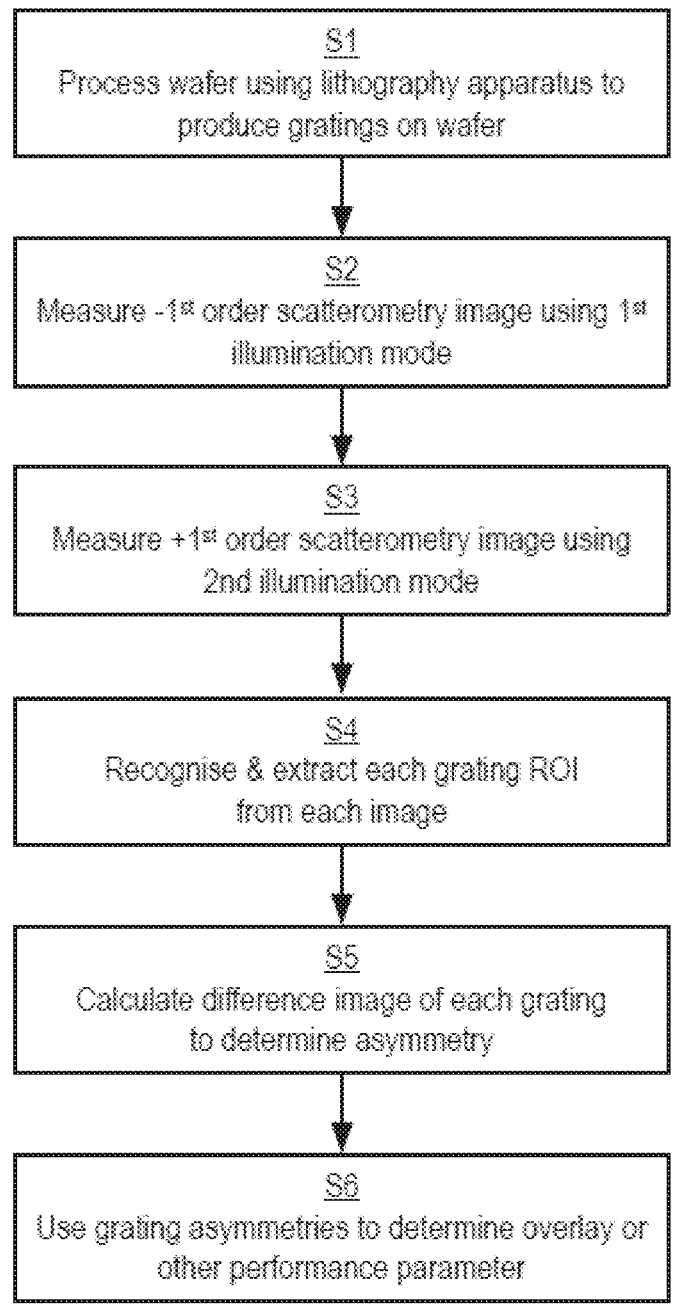
FIG. 6 is a flow chart showing a method of estimating overlay.

FIG. 6 illustrates how, using for example the method described in application WO 2011/012624, overlay error between the two layers containing first and/or second features, such as the component gratings 32 to 35 is measured through asymmetry of the gratings, as revealed by comparing their intensities in the +1 order and −1 order dark field images. At step S1, the substrate, for example a semiconductor wafer, is processed through the lithographic cell of FIG. 2(a) one or more times, to create a structure including the overlay targets 32-35. At S2, using the metrology apparatus of FIG. 3(a), an image of the gratings 32 to 35 is obtained by using one of the first order diffracted beams (say −1). Then, whether by changing the illumination mode, or changing the imaging mode, or by rotating substrate W by 180° in the field of view of the metrology apparatus, a second image of the gratings using the other first order diffracted beam (+1) can be obtained (step S3). Consequently the +1 diffracted radiation is captured in the second image.

Note that, by including only half of the first order diffracted radiation in each image, the 'images' referred to here are not conventional dark field microscopy images. The individual grating lines will not be resolved. Each grating will be represented simply by an area of a certain intensity level. In step S4, a region of interest (ROI) is identified within the image of each component grating, from which intensity levels will be measured. This is done because, particularly around the edges of the individual grating images, intensity values can be highly dependent on process variables such as resist thickness, composition, line shape, as well as edge effects generally.

Having identified the ROI for each individual grating and measured its intensity, the asymmetry of the grating structure, and hence overlay error, can then be determined. This is done by the processor, e.g. the image processor, and controller PU in step S5 comparing the intensity values obtained for +1 and −1 orders for each grating 32-35 to identify any difference in their intensity, and (S6) from knowledge of the overlay biases of the gratings to determine overlay error in the vicinity of the target T.

In the prior applications, mentioned above, various techniques are disclosed for improving the quality of overlay measurements. For example, the intensity differences between images may be attributable to differences in the optical paths used for the different measurements, and not purely asymmetry in the target. The illumination source 11 may be such that the intensity and/or phase of illumination spot 31 is not uniform. Corrections can be determined and applied to minimize such errors, by reference for example to the position of the target image in the image field of sensor 23. These techniques are explained in prior applications, and will not be explained here in further detail. They may be used in combination with the techniques newly disclosed in the present application, which are described herein.

Overlay measurements according to exemplary methods assume that the measured asymmetry is proportional to the actual overlay shift between grating layers. However, this is not necessarily the case as the measured asymmetry is also affected by feature asymmetry effects that occur in production of the gratings. These feature asymmetry effects include side-wall angle asymmetry and floor-tilt, and perturb the first order asymmetry-based overlay measurement, which will result in a less accurate overlay measurement.

Figure 7:
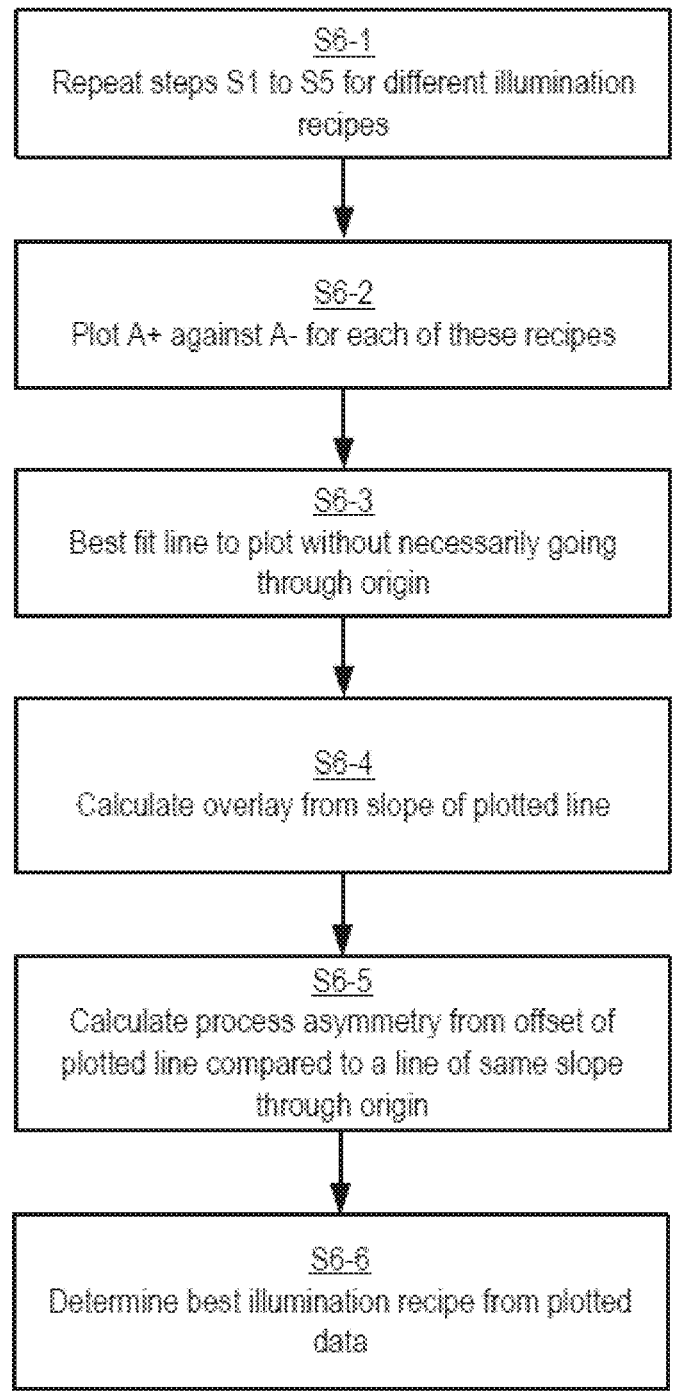
FIG. 7 is a flow chart showing a method of estimating overlay.

FIG. 7 is a flowchart adapting step S6 of the flowchart of FIG. 6 to use an A+ versus A− regression to analyze diffraction-based overlay measurements (DBO and µDBO), by determining the asymmetry of the positively biased grating A+ as function of the asymmetry of the negatively biased grating A−. As used herein, the terms A+ and A+ may be termed "asymmetry intensities". The term A+ relates to the comparison of the intensity of the first and second images discussed above and determined for the positively (+d) overlay biased grating. Further, A− relates to the comparison of the intensity of the first and second images discussed above and determined for the negatively (−d) overlay biased grating.

At step S6-1 A+ and A− are determined for a number of different measured pupil pixels and/or a number or different wavelength-polarization combinations (i.e. for a number of different illumination conditions or illumination "recipes"). In some examples, A+ and A− may be determined using light emitted from the optical system at a plurality of wavelengths. Following this, at step S6-2, the determined values of A+ may be plotted against the determined values of A− to yield the overlay. It is noted that actually plotting the A+ and A− values may not be necessary and the overlay may be estimated by undertaking a regression analysis on the A+ and A− values.

Figure 8:
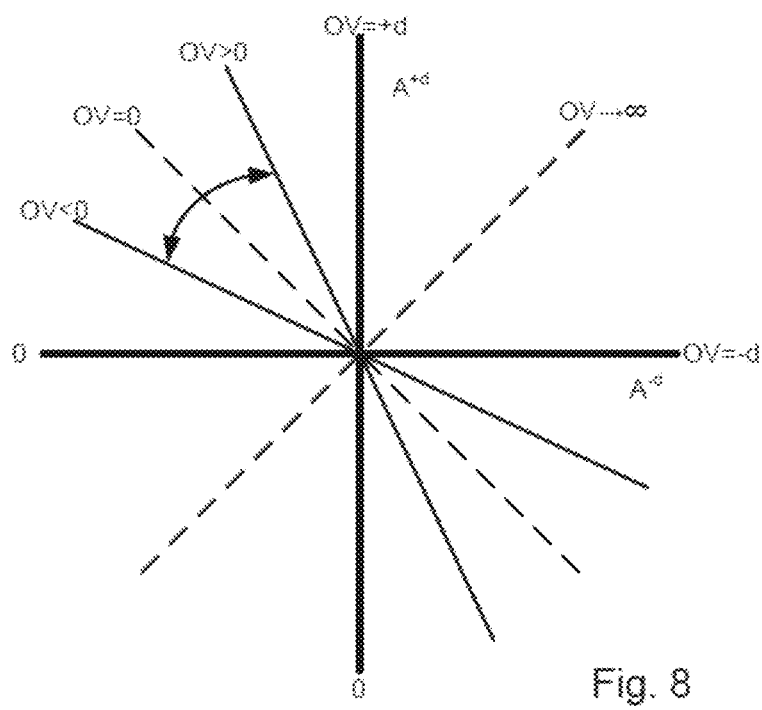
FIG. 8 is a plot of A+ against A− for overlay gratings that have no feature asymmetry.

FIG. 8 is a plot of A+ against A− for overlay gratings that have no feature asymmetry, such that the only asymmetry present is the asymmetry due to the overlay bias (±d) and overlay. In this case, the relation between A+ and A− lies on a straight line through the origin and regression analysis may be undertaken on the A+ and A− (asymmetry intensity) data to determine the position and gradient of the line. All measured wavelength-polarization combinations lie on this line. The slope of this line is related to, and can be used to determine, the overlay. The Figure shows four lines:
  the dotted line labeled OV=0 is a line indicating zero overlay, having a slope of −1;
  the dotted line labeled OV→∞ is a line having a slope of +1, indicative of overlay approaching infinity;
  the solid line labeled OV<0 is a line having a slope less than −1 which indicates overlay less than zero; and
  the solid line labeled OV>0 is a line having a slope greater than −1 which indicates overlay greater than zero.

Additionally, it can be seen that overlay equal to +d, where d is the grating bias, would result in a plotted line along the y-axis; and overlay equal to −d would result in a plotted line along the x-axis.

Figure 9:
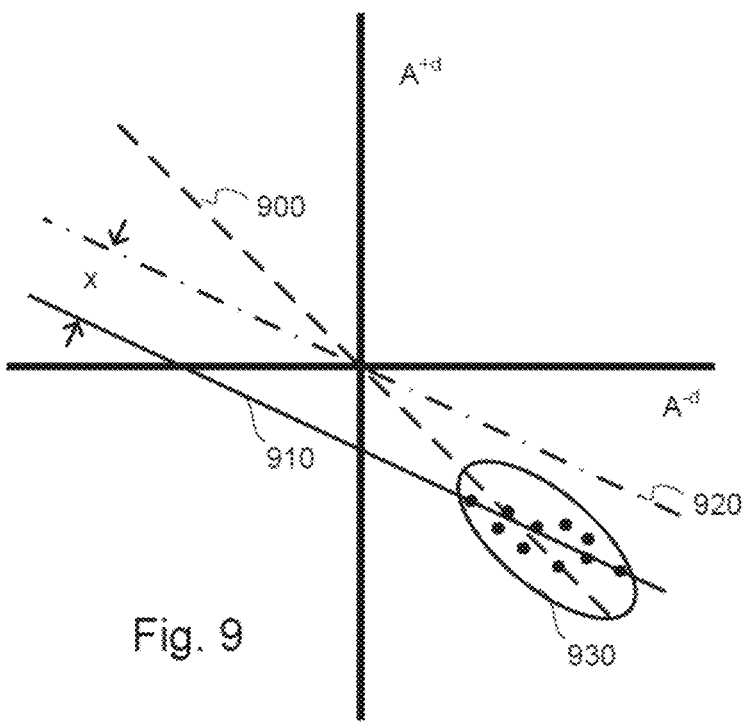
FIG. 9 is a plot of A+ against A− for overlay gratings having feature asymmetry.

FIG. 9 is a plot of A+ against A− illustrating the first two of these aspects, such as may be plotted in step S6-2. According to the method discussed above, data points 930 would be fitted with a line 900 through the origin. However, in this embodiment the data points are fitted according to a best fit method (for example, least squares) by a line 910 not necessarily going through the origin (step S6-3). In this way the overlay can still be calculated from the slope of the line 910 (step S6-4); it can be seen that line 910 is parallel to a line 920 indicative of that which would be seen for the same measured structure having no feature asymmetry. The axis intercept of line 910, that is the offset of line 910 from line 920 (a line having the same slope as line 910, but plotted through the origin) indicates quantitatively the effect of the feature asymmetry (step S6-5).

With "d" the overlay-bias of the two symmetrically biased gratings of the target and "slope" the slope of line 910, the overlay can be calculated from FIG. 9 as (with a linearized relation between the asymmetry and the overlay):

$$\text{overlay} = d \cdot \frac{\text{slope}+1}{\text{slope}-1} \quad (1)$$

For a pitch-periodic sine-relation the overlay can similarly be understood as:

$$\text{overlay} = \frac{\text{pitch}}{2\pi} a\tan\left\{\frac{\text{slope}+1}{\text{slope}-1} \cdot \tan\left(\frac{2\pi \cdot d}{\text{pitch}}\right)\right\} \quad (2)$$

where "pitch" is the grating pitch.

The above process may be termed asymmetry intensity regression analysis and it is possible to use asymmetry intensity regression analysis to determine a parameter, such as overlay, in a lithographic process. However, the number of different wavelength-polarization combinations emitted from the optical system and used in determination of the asymmetry intensities and then subsequently used for the regression analysis has a significant effect on the accuracy and quality of the determined overlay. There must be a plurality of wavelength-polarization combinations and more than two may be considered desirable.

In equation terms, the relationship between overlay error OVE and intensity asymmetry A is assumed to be:

$$A_{\pm d} = K_1 \sin(OV_E \pm d) \quad (3)$$

Where overlay error OVE is expressed on a scale such that the target pitch P corresponds to an angle $2\pi$ radians. Using two measurements of gratings with different, known overlay biases (e.g. +d and −d), the overlay error OVE can be calculated using:

$$OV_E = a\tan\left(\frac{A_{+d} + A_{-d}}{A_{+d} - A_{-d}} \cdot \tan(d)\right) \quad (4)$$

A first effect of introducing structural (or feature) asymmetry, for example the bottom grating asymmetry, is that the 'ideal' sinusoidal curve of equation (1) no longer applies. However, at least approximately, bottom grating asymmetry or other structural asymmetry has the effect of adding an intensity shift term K0 and a phase shift term φ to the intensity asymmetry $A_{\pm d}$. The intensity shift term K0 and phase shift term φ are dependent upon a combination of the target and a selected characteristic of the measurement radiation, such as the wavelength and/or polarization of the measurement radiation, and is sensitive to process variations. In equation terms, the relationship used for calculation overlay becomes:

$$A_{\pm d} = K_0 + K_1 \sin(OV_E \pm d + \phi) \quad (5)$$

Each measurement of asymmetry intensity using a different wavelength-polarization combination adds a time burden to the metrology process. Further, only a limited number of wavelengths may be emitted by the optical system and therefore only a limited number of wavelength-polarization combinations are possible.

The inventors have appreciated that for large feature asymmetries, the asymmetry intensity regression analysis method begins to be less accurate. This is because feature asymmetries cause errors in the asymmetry intensity data, which, when significant, can make it difficult to fit a straight line to the data accurately. This effect may be seen by determining a quality of the determined overlay. In one example, the quality of the determined overlay may be identified by determining a goodness of fit in the regression analysis to the asymmetry intensity data. That is, the quality of the determined overlay may be identified by how well the straight line of FIG. 8 fits the plotted asymmetry intensity (A+/A−) data. The goodness of fit may be represented by $R^2$, which is the sum of the squares of the distances of the plotted asymmetry intensity data from the determined straight line.

In view of the above, the inventors have developed methods and apparatus to determine a quality of an overlay measurement based on a relationship between the overlay estimate and a measure of feature asymmetry. In exemplary arrangements, the measure of feature asymmetry may be determined using distance to origin value or intercept value for the regression analysis data, as explained below, although other methods of determining a measure of feature asymmetry may also be used.

In exemplary arrangements, the relationship may be determined using one or more further substrates that are representative of the substrate on which the measurement is to be taken, a tested substrate. In such arrangements, and as explained below, a plurality of features, which may comprise first and second features and may specifically be pairs of gratings 32, 35, on the further substrate may be subjected to the asymmetry intensity regression analysis method described above. A measure of quality of the overlay estimation, such as the goodness of fit of the regression analysis data, for each of the features may be plotted against the measure of feature asymmetry for the same pair of features to determine a relationship therebetween. In exemplary arrangements, the measure of feature asymmetry may comprise an offset of the straight line determined in the regression analysis from an origin. This may be also be known as distance to origin, or may be defined as an intercept value or term, that is a value at which the regression analysis data intercepts one or both of the X and Y axes.

Figure 10:
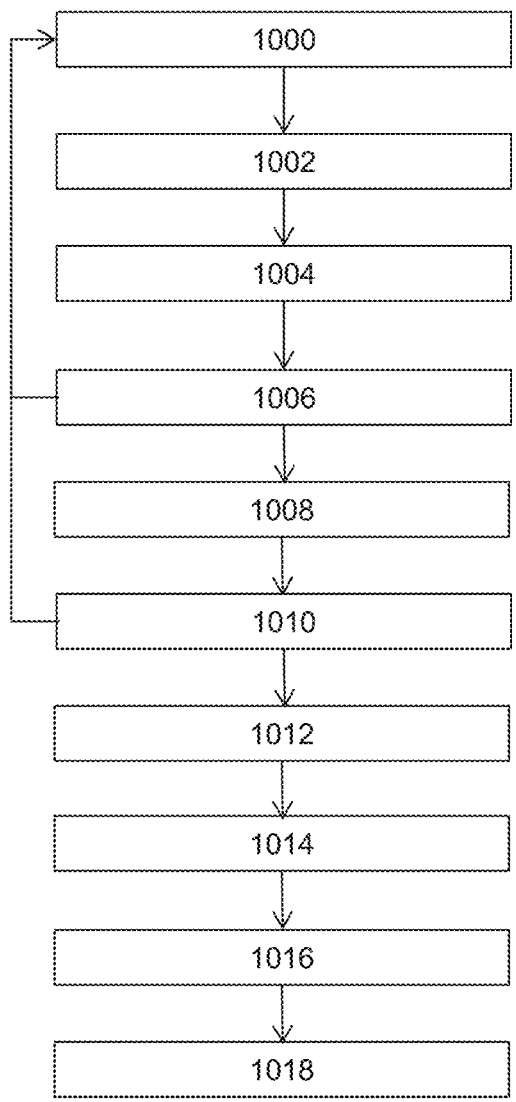
FIG. 10 is a flow chart showing a method for determining a relationship between feature asymmetry and quality of a parameter of a lithographic process.

FIG. 10 shows a flow diagram for a set-up phase of exemplary arrangements, in which a relationship is determined in respect of one or more further substrates representative of the tested substrate, which may be example or set-up wafers WE, between a measure of quality of an overlay estimate and a measure of feature asymmetry of one or more features of the example water WE.

The optical system of the metrology apparatus shown in FIG. 3(a) emits 1000 radiation at a first wavelength-polarization towards one or more of first and second features of the example substrate (or wafer) WE. The first and second features may form at least part of a metrology target T, such as that shown in FIGS. 3(b) and 4. In exemplary arrangements, the metrology apparatus may be configured to allow radiation diffracted from the target T and having higher diffractive orders, such as ±1 to be incident 1002 on the sensor 23 or on the sensor 19 using the same or similar methods to those discussed above.

The image processor and controller CU determines 1004 asymmetry intensity data (A+/A−) for the target T at the first wavelength-polarization based on the diffracted light, in the same or a similar way to the methods discussed above.

In exemplary arrangements, radiation is emitted by the optical system at one or more further wavelength-polarizations and in specific arrangements at a plurality of further wavelength-polarizations. In fact, during this set-up phase, radiation is emitted at, for example, 5, 10 or more wavelength-polarizations so as to provide more data points for subsequent regression analysis. At step 1006 it is determined whether more wavelength-polarizations are to be emitted and, if so, steps 1000 to 1004 are repeated for each wavelength-polarization to give a plurality of pairs of asymmetry intensity data (A+/A−) for the target T and each pair determined based on a different wavelength-polarization. These pairs of asymmetry intensity data that may be plotted and subjected to regression analysis 1008, as discussed above, to provide regression analysis data. It is noted that in exemplary arrangements, the plurality of wavelength-polarizations are emitted sequentially.

Figure 11:
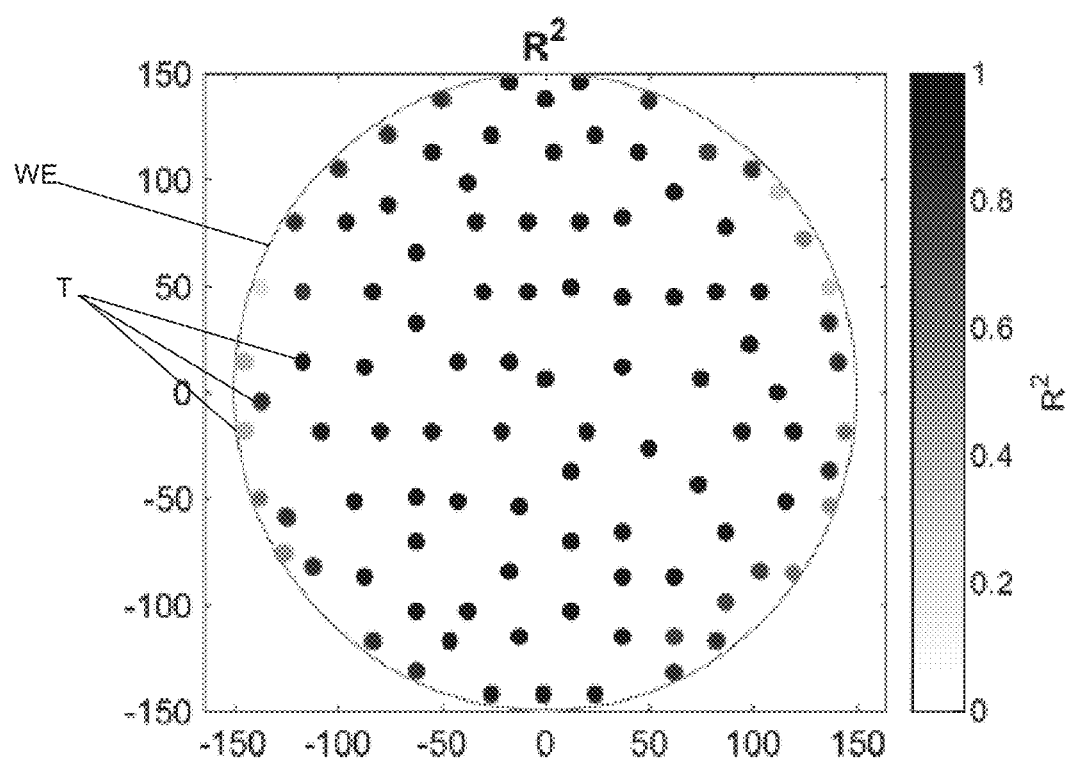
FIG. 11 shows a distribution of targets on a wafer and a measure of goodness of fit for each target.

A plurality of targets T may be distributed around the substrate and asymmetry intensity data and corresponding regression analysis data may be determined for each target T. In exemplary arrangements and as shown in FIG. 11, an example wafer WE may have targets T distributed across the surface thereof. Each target T on the substrate may exhibit different feature asymmetry and/or overlay and this property may be exploited to allow the determination of the relationship between a quality the overlay estimate and the amount of feature asymmetry present in the target T. Alternatively or in addition, the feature asymmetry of the targets T may be controlled in order to provide a range of measures of feature asymmetry (e.g. DTO) thereby allowing the determination of the relationship.

At step 1010 it is determined whether more targets are to be illuminated and if so, steps 1000 to 1008 are repeated for each of the plurality of targets T. This produces a plurality of sets of asymmetry intensity data (A+/A−), one set for each target T.

Regression analysis is undertaken 1012 on each set of asymmetry intensity data for each of the targets and a model is thereby fitted to each set of asymmetry intensity data, from which the overlay may be determined. In exemplary arrangements the model is linear and a straight line is fitted to the asymmetry intensity data but other, non-linear models may be used. When using a linear model, a slope of the straight line is an estimate of the overlay of the target T and an intercept value is an estimate of the feature asymmetry in the target T. Further, the better the straight line fits to the asymmetry intensity data, the better the quality of the overlay estimate that may be determined from the gradient of the straight line defined by the regression analysis data.

The inventors have realized that the quality of overlay estimate is related to the amount of feature asymmetry in the target T and that this relationship can be determined and used when measuring overlay on subsequent wafers.

In exemplary arrangements, the quality of the overlay estimate may be determined using goodness of fit of the regression analysis data to the set of asymmetry intensity data for each target. In specific examples, an $R^2$ measurement may be used to determine the quality of the overlay estimate. Such a measure of quality of the overlay estimate is therefore determined 1014 for each target T.

In exemplary arrangements, the feature asymmetry in a target T may be determined using an intercept term for the regression analysis data, or a DTO value. As explained above, an increase in DTO represents an increase in feature asymmetry. A measure of feature asymmetry is determined 1016 for each target T for which a set of asymmetry data was determined.

Figure 12:
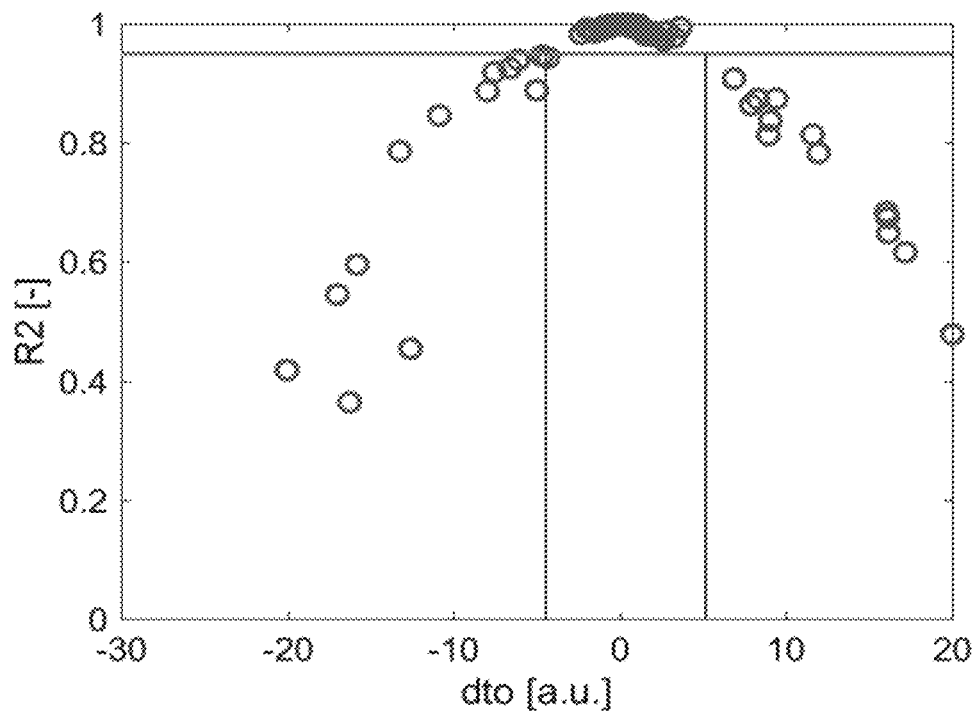
FIG. 12 shows a plot of goodness of fit against feature asymmetry for an example wafer.

As shown in FIG. 12, the quality of the overlay estimate (in this case $R^2$) and the measure of feature asymmetry (in this case DTO) for each target T may be plotted or otherwise analyzed to determine a relationship therebetween for the example wafer. As shown in FIG. 12, the quality of the overlay measurement reduces as the magnitude of DTO of the regression analysis data increases. This allows a threshold value for the measure of feature asymmetry to be determined 1018, over which the quality of the overlay measurement is not of sufficient quality and which can then be used when measuring overlay on subsequent wafers. In the exemplary case of FIG. 12, a goodness of fit of 0.95 is determined to provide the required degree of accuracy of overlay measurement. It can be seen that this requires a DTO in a range from −5 to +5.

The process outlined above and shown in FIG. 10 may be repeated for a plurality of wafers and the resulting threshold values may all be used to define the final threshold value to be used during overlay measurement on subsequent wafers. It should also be noted that the threshold values determined as set out above may be stack and measurement mode dependent and may therefore need to be determined for each of a plurality of different stacks in dependence on the stack to be measured on tested substrates.

Figure 13:
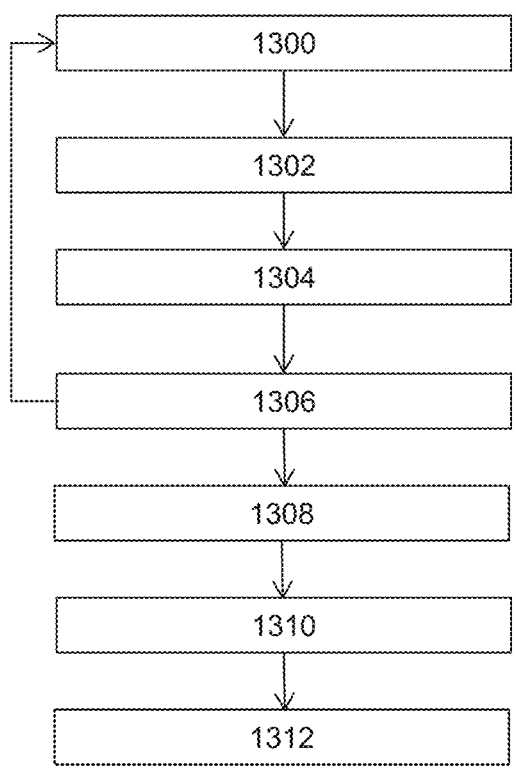
FIG. 13 is a flow chart showing a method for determining a quality of a measurement of a parameter of a lithographic process based on the relationship between feature asymmetry and quality of a parameter of a lithographic process.

Following the determination of the relationship between the quality of the overlay estimate and the feature asymmetry in the set-up phase, the relationship may be used in the process shown in FIG. 13, for example, to determine the level of accuracy of an overlay measurement on a tested substrate.

The optical system of the metrology apparatus shown in FIG. 3(*a*) emits 1300 radiation at a first wavelength-polarization towards one or more first and/or second features of a tested substrate (or wafer) W. The first and second features may form at least part of a metrology target T, such as that shown in FIGS. 3(*b*) and 4. In exemplary arrangements, the metrology apparatus may be configured to allow radiation diffracted from the target T and having higher diffractive orders, such as ±1 to be incident 1302 on the sensor 23 or on the sensor 19 using the same or similar methods to those discussed above.

The image processor and controller CU determines 1304 asymmetry intensity data (A+/A−) for the target T at the first wavelength-polarization based on the diffracted light, in the same or a similar way to the methods discussed above.

In exemplary arrangements, radiation is emitted by the optical system at one or more further wavelength-polarizations and in specific arrangements at a plurality of further wavelength-polarizations. In fact, during this measurement phase, radiation is emitted at 2, but possibly more wavelength-polarizations so as to provide sufficient data points for subsequent regression analysis. At step 1306 it is determined whether more wavelength-polarizations are to be emitted and, if so, steps 1300 to 1304 are repeated for each wavelength-polarization to give a plurality of pairs of asymmetry intensity data (A+/A−) for the target T on the substrate to be tested. Each pair determined based on a different wavelength-polarization. These pairs of asymmetry intensity data that may be plotted and subjected to regression analysis 1308, as discussed above, to provide regression analysis data for target T on the substrate to be tested.

The regression analysis data may be used to determine 1310 a measure of feature asymmetry of the target T on the substrate to be tested. In the example used herein, feature asymmetry may be determined based on the DTO of the regression analysis data determined for the target T of the tested substrate.

The relationship between feature asymmetry and quality of overlay estimate may now be used to determine 1312 the quality of the overlay estimate. For example, the determined relationship may be used to determine what the goodness of fit would have been for the overlay estimate if more asymmetry intensity data were to be calculated from radiation emitted at a greater number of wavelength-polarizations. Further, the thresholds determined in the set-up phase may also allow the rejection of an overlay estimate if the regression analysis data for the target T on the tested substrate has a DTO (or other feature asymmetry measure) greater than the threshold.

An advantage of the invention is that the measurement undertaken on the tested substrate requires radiation to be emitted at fewer (as little as two) wavelength-polarizations and still providing an understanding of the accuracy of the resulting overlay estimate. As will be appreciated, the goodness of fit of regression analysis data using two points is always 1. However, using the exemplary methods and apparatus disclosed herein, even when only two wavelength-polarizations are used, the accuracy of the resulting overlay measurement may be determined based on a measure of feature asymmetry (e.g. the DTO) in the in the target T.

The examples provided above are based around measurement of overlay, although it is noted that accuracy of other parameters could also be determined using the same or a similar technique. Further, the measure of feature asymmetry may be determined using alternative methods, such as with a Bottom Grating Asymmetry (BGA) target, which may have a single layer grating. In such arrangements, the feature asymmetry may be determined by emission of radiation from the optical system at only one wavelength-polarization. Further, if feature asymmetry and overlay (or another parameter) are to be determined using separate targets, exemplary arrangements may have those separate targets collocated on the example substrate and the substrate to be tested. The separate targets may be adjacent to each other in the X-Y plane or may be positioned proximal to each other in the X-Y plane such that the feature asymmetry of each target is within a tolerance.

Figure 14:
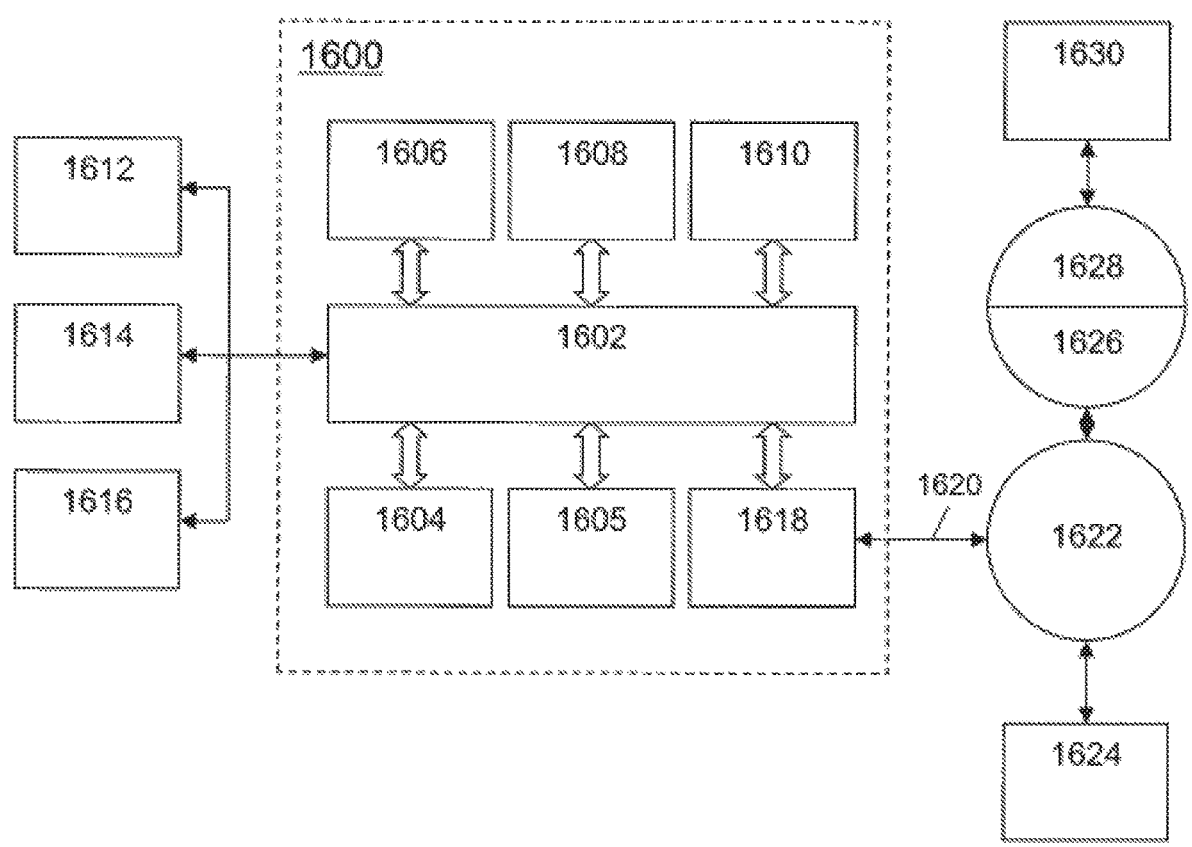
FIG. 14 is a schematic representation of a computer system.

FIG. 14 is a block diagram that illustrates a computer system 1600 that may assist in implementing the methods and flows disclosed herein. Computer system 1600 includes a bus 1602 or other communication mechanism for communicating information, and a processor 1604 (or multiple processors 1604 and 1605) coupled with bus 1602 for processing information. The processor(s) may be configured to undertake any of the methods disclosed herein. Computer system 1600 also includes a main memory 1606, such as a random access memory (RAM) or other dynamic storage device, coupled to bus 1602 for storing information and instructions to be executed by processor 1604. Main memory 1606 also may be used for storing temporary variables or other intermediate information during execution of instructions to be executed by processor 1604. Computer system 1600 further includes a read only memory (ROM) 1608 or other static storage device coupled to bus 1602 for storing static information and instructions for processor 1604. A storage device 1610, such as a magnetic disk or optical disk, is provided and coupled to bus 1602 for storing information and instructions.

Computer system 1600 may be coupled via bus 1602 to a display 1612, such as a cathode ray tube (CRT) or flat panel or touch panel display for displaying information to a computer user. An input device 1614, including alphanumeric and other keys, is coupled to bus 1602 for communicating information and command selections to processor 1604. Another type of user input device is cursor control 1616, such as a mouse, a trackball, or cursor direction keys for communicating direction information and command selections to processor 1604 and for controlling cursor movement on display 1612. This input device typically has two degrees of freedom in two axes, a first axis (e.g., x) and a second axis (e.g., y), that allows the device to specify positions in a plane. A touch panel (screen) display may also be used as an input device.

One or more of the methods as described herein may be performed by computer system 1600 in response to processor 1604 executing one or more sequences of one or more instructions contained in main memory 1606. Such instructions may be read into main memory 1606 from another computer-readable medium, such as storage device 1610. Execution of the sequences of instructions contained in main memory 1606 causes processor 1604 to perform the process steps described herein. One or more processors in a multi-processing arrangement may also be employed to execute the sequences of instructions contained in main memory 1606. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 1604 for execution. Such a medium may take many forms, including but not limited to, non-volatile media, volatile media, and transmission media. Non-volatile media include, for example, optical or magnetic disks, such as storage device 1610. Volatile media include dynamic memory, such as main memory 1606. Transmission media include coaxial cables, copper wire and fiber optics, including the wires that comprise bus 1602. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 1604 for execution. For example, the instructions may initially be borne on a magnetic disk of a remote computer. The remote computer can load the instructions into its dynamic memory and send the instructions over a telephone line using a modem. A modem local to computer system 1600 can receive the data on the telephone line and use an infrared transmitter to convert the data to an infrared signal. An infrared detector coupled to bus 1602 can receive the data carried in the infrared signal and place the data on bus 1602. Bus 1602 carries the data to main memory 1606, from which processor 1604 retrieves and executes the instructions. The instructions received by main memory 1606 may optionally be stored on storage device 1610 either before or after execution by processor 1604.

Computer system 1600 also preferably includes a communication interface 1618 coupled to bus 1602. Communication interface 1618 provides a two-way data communication coupling to a network link 1620 that is connected to a local network 1622. For example, communication interface 1618 may be an integrated services digital network (ISDN) card or a modem to provide a data communication connection to a corresponding type of telephone line. As another example, communication interface 1618 may be a local area network (LAN) card to provide a data communication connection to a compatible LAN. Wireless links may also be implemented. In any such implementation, communication interface 1618 sends and receives electrical, electromagnetic or optical signals that carry digital data streams representing various types of information.

Network link 1620 typically provides data communication through one or more networks to other data devices. For example, network link 1620 may provide a connection through local network 1622 to a host computer 1624 or to data equipment operated by an Internet Service Provider (ISP) 1626. ISP 1626 in turn provides data communication services through the worldwide packet data communication network, now commonly referred to as the "Internet" 1628. Local network 1622 and Internet 1628 both use electrical, electromagnetic or optical signals that carry digital data streams. The signals through the various networks and the signals on network link 1620 and through communication interface 1618, which carry the digital data to and from computer system 1600, are exemplary forms of carrier waves transporting the information.

Computer system 1600 may send messages and receive data, including program code, through the network(s), network link 1620, and communication interface 1618. In the Internet example, a server 1630 might transmit a requested code for an application program through Internet 1628, ISP 1626, local network 1622 and communication interface 1618. One such downloaded application may provide for one or more of the techniques described herein, for example. The received code may be executed by processor 1604 as it is received, and/or stored in storage device 1610, or other non-volatile storage for later execution. In this manner, computer system 1600 may obtain application code in the form of a carrier wave.

Further embodiments are disclosed in the subsequent numbered clauses:

1. An apparatus for estimating a parameter of a lithographic process that has been undertaken on a tested substrate, the estimation being based on regression analysis data that has been determined by a regression analysis of asymmetry intensity data that has, in turn, been determined using radiation emitted by an optical system at one or more wavelengths and diffracted by at least first features of the tested substrate, the apparatus comprising:
   a processor configured to determine a quality of the estimate of the parameter relating to the tested substrate based on a measure of feature asymmetry in the at least first features of the tested substrate and further based on a relationship determined for a plurality of corresponding at least first features of at least one further substrate representative of the tested substrate, the relationship being between a measure of quality of an estimate of the parameter relating to the at least one further substrate and a measure of feature asymmetry in the corresponding first features.
2. An apparatus according to clause 1, wherein the estimation is based on radiation emitted by the optical system at a plurality of wavelengths.
3. An apparatus according to clause 1 or 2, wherein the emitted radiation is diffracted by the first features and by second features, the first feature having a positive overlay bias and the second feature having a negative overlay bias.
4. An apparatus according to clause 3, wherein the relationship is determined for a plurality of pairs of corresponding first and second features on the at least one further substrate.
5. An apparatus according to any preceding clause, wherein the measure of feature asymmetry comprises an intercept term of the regression analysis data.
6. An apparatus according to any preceding clause, wherein the measure of quality of the estimate of the parameter for the at least one further substrate comprises a goodness of fit of corresponding regression analysis data for the at least one further substrate.
7. An apparatus according to clause 6, wherein the corresponding regression analysis for the further substrate has been determined using radiation emitted and diffracted from the plurality of corresponding at least first features of the at least one further substrate at a number of wavelengths greater than the one or more wavelengths emitted by the optical system.
8. An apparatus according to any preceding clause, wherein the processor is further configured to disregard the estimate of the parameter on the tested substrate if a magnitude of the measure of feature asymmetry in the at least first features of the tested substrate exceeds a threshold value that is based on the relationship determined for the corresponding at least first features of at least one further substrate.
9. An apparatus according to any preceding clause, wherein the at least first features form part of a metrology target.
10. An apparatus according to any preceding clause, wherein the optical system is configured to emit radiation at wavelengths in ranges from: 400 nm to 900 nm; 0.1 nm to 100 nm; and/or 10 nm to 20 nm.
11. An apparatus according to any preceding clause, wherein the processor is further configured, based on radiation emitted by the optical system at three or more wavelengths and diffracted from the plurality of corresponding at least first features of the further substrate, to:
    determine further substrate asymmetry intensity data for the plurality of corresponding at least first features relating to the further substrate;
    based on the determined further substrate asymmetry intensity data, determine the measure of quality of the estimate of the parameter relating to the at least one further substrate and the measure of feature asymmetry relating to the further substrate; and
    determine the relationship between the measure of quality of the estimate of the parameter relating to the at least one further substrate and the measure of feature asymmetry in the plurality of corresponding at least first features.
12. An apparatus according to clause 11, wherein the processor is further configured to determine the measure of quality of the estimate of the parameter relating to the at least one further substrate by undertaking a regression analysis on the further substrate asymmetry intensity data.
13. An apparatus according to clause 12, wherein the measure of quality of the estimate of the parameter relating to the at least one further substrate comprises a goodness of fit of the regression analysis.
14. An apparatus according to any of clauses 11 to 13, wherein the processor is further configured to determine the measure of feature asymmetry in the plurality of corresponding at least first features based on the determined further substrate asymmetry intensity data.
15. An apparatus according to clause 14, wherein the measure of feature asymmetry in the plurality of corresponding at least first features comprises an intercept term of the regression analysis.
16. An apparatus according to any preceding clause, further comprising one or more of: the optical system; and a sensor configured to sense the diffracted radiation.

17. An apparatus according to any preceding clause, wherein the parameter of the lithographic process comprises overlay.
18. An apparatus for determining a relationship between a measure of quality of an estimate of a parameter of a lithographic process and a measure of feature asymmetry in a plurality of at least first features of at least one example substrate, based on radiation emitted by an optical system at one or more wavelengths and diffracted from the plurality of at least first features of the example substrate, the apparatus comprising a processor configured to:
   determine asymmetry intensity data for the plurality of at least first features relating to the at least one example substrate based on the diffracted radiation;
   based on the determined asymmetry intensity data, determine the measure of quality of the estimate of the parameter relating to the at least one example substrate and the measure of feature asymmetry relating to the further substrate; and
   determine the relationship between the measure of quality of the estimate of the parameter relating to the at least one example substrate and the measure of feature asymmetry in the plurality of at least first features.
19. An inspection apparatus comprising the apparatus of any preceding clause.
20. The inspection apparatus of clause 19, wherein the inspection apparatus s a metrology apparatus.
21. A lithographic apparatus comprising an apparatus according to any one of the clauses 1 to 18.
22. A lithographic cell comprising an apparatus according to any one of the clauses 1 to 20.
23. A method for estimating a parameter of a lithographic process that has been undertaken on a tested substrate, the estimation being based on regression analysis data that has been determined by a regression analysis of asymmetry intensity data that has, in turn, been determined using radiation emitted by an optical system at one or more wavelengths and diffracted by at least first features of the tested substrate, the method comprising:
   determining a quality of the estimate of the parameter relating to the tested substrate based on a measure of feature asymmetry in the at least first features of the tested substrate and further based on a relationship determined for a plurality of corresponding at least first features of at least one further substrate representative of the tested substrate, the relationship being between a measure of quality of an estimate of the parameter relating to the at least one further substrate and a measure of feature asymmetry in the corresponding first features.
24. A method according to clause 23, wherein the destination is based on radiation emitted by the optical system at a plurality of wavelengths,
25. A method according to clause 23 or 24, wherein the emitted radiation is diffracted by the first features and by second features, the first feature having a positive overlay bias and the second feature having a negative overlay bias.
26. A method according to clause 25, wherein the relationship is determined for a plurality of pairs of corresponding first and second features on the at least one further substrate.
27. A method according to any of clauses 23 to 26, wherein the measure of feature asymmetry comprises an intercept term of the regression analysis data.
28. A method according to any of clauses 23 to 27, wherein the measure of quality of the estimate of the parameter for the at least one further substrate comprises a goodness of fit of corresponding regression analysis data for the at least one further substrate.
29. A method according to clause 28, wherein the corresponding regression analysis for the further substrate has been determined using radiation emitted and diffracted from the plurality of corresponding at least first features of the at least one further substrate at a number of wavelengths greater than the one or more wavelengths emitted by the optical system.
30. A method according to any of clauses 23 further comprising disregarding the estimate of the parameter on the tested substrate if a magnitude of the measure of feature asymmetry in the at least first features of the tested substrate exceeds a threshold value that is based on the relationship determined for the corresponding at least first features of at least one further substrate.
31. A method according to any of clauses 23 to 30, wherein the at least first features form part of a metrology target,
32. A method according to any of clauses 2.3 to 31, wherein the optical system is configured to emit radiation at wavelengths in ranges from: 400 nm to 900 nm; 0.1 nm to 100 nm; and/or 10 nm to 20 nm.
33. A method according to any of clauses 23 to 32, further comprising, based on radiation emitted by the optical system at three or more wavelengths and diffracted from the plurality of corresponding at least first features of the further substrate:
   determining further substrate asymmetry intensity data for the plurality of corresponding at least first features relating to the further substrate;
   based on the determined further substrate asymmetry intensity data, determining the measure of quality of the estimate of the parameter relating to the at least one further substrate and the measure of feature asymmetry relating to the further substrate; and
   determining the relationship between the measure of quality of the estimate of the parameter relating to the at least one further substrate and the measure of feature asymmetry in the plurality of corresponding at least first features.
34. A method according to clause 33, further comprising determining the measure of quality of the estimate of the parameter relating to the at least one further substrate by undertaking a regression analysis on the further substrate asymmetry intensity data.
35. A method according to clause 34, wherein the measure of quality of the estimate of the parameter relating to the at least one further substrate comprises a goodness of fit of the regression analysis.
36. A method according to any of clauses 33 to 35, further comprising determining the measure of feature asymmetry in the plurality of corresponding at least first features based on the determined further substrate asymmetry intensity data.
37. A method according to clause 36, wherein the measure of feature asymmetry in the plurality of corresponding at least first features comprises an intercept term of the regression analysis.
38. A method according to any of clauses 23 to 37, wherein the parameter of the lithographic process comprises overlay.
39. A method for determining a relationship between a measure of quality of an estimate of a parameter of a lithographic process and a measure of feature asymmetry in a plurality of at least first features of at least one example substrate, based on radiation emitted by an optical system at one or more wavelengths and diffracted from the plurality of at least first features of the example substrate, the method comprising:
  determining asymmetry intensity data for the plurality of at least first features relating to the at least one example substrate based on the diffracted radiation;
  based on the determined asymmetry intensity data, determining the measure of quality of the estimate of the parameter relating to the at least one example substrate and the measure of feature asymmetry relating to the further substrate; and
  determining the relationship between the measure of quality of the estimate of the parameter relating to the at least one example substrate and the measure of feature asymmetry in the plurality of at least first features.

40. A computer program comprising instructions which, when executed on at least one processor, cause the at least one processor to control an apparatus to carry out the method according to any of clauses 23 to 39.

41. A carrier containing the computer program of clause 40, wherein the carrier is one of an electronic signal, optical signal, radio signal, or non-transitory computer readable storage medium.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A lithographic apparatus comprising:
  an apparatus configured to estimate a parameter of a lithographic process that has been undertaken on a tested substrate, the estimation being based on regression analysis data that has been determined by a regression analysis of asymmetry intensity data that has, in turn, been determined using radiation emitted by an optical system at one or more wavelengths and diffracted by at least first features of the tested substrate, the apparatus comprising:
    a processor configured to determine a quality of the estimate of the parameter relating to the tested substrate based on a measure of feature asymmetry in the at least first features of the tested substrate and further based on a relationship determined for a plurality of corresponding at least first features of at least one further substrate representative of the tested substrate, the relationship being between a measure of quality of an estimate of the parameter relating to the at least one further substrate and a measure of feature asymmetry in the corresponding first features,
    wherein the at least first features of the tested substrate and the corresponding first features of the at least one further substrate each comprise an overlay biased grating,
    wherein the measure of feature asymmetry in the at least first features and the corresponding first features is determined by a distance-to-origin (DTO) value, and
    wherein the processor is further configured to reject the estimate of the parameter on the tested substrate if a magnitude of the DTO value in the at least first features of the tested substrate exceeds a threshold value that is based on a goodness of fit of a regression analysis on further substrate asymmetry intensity data.

2. An apparatus for estimating a parameter of a lithographic process that has been undertaken on a tested substrate, the estimation being based on regression analysis data that has been determined by a regression analysis of asymmetry intensity data that has, in turn, been determined using radiation emitted by an optical system at one or more wavelengths and diffracted by at least first features of the tested substrate, the apparatus comprising:
  a processor configured to determine a quality of the estimate of the parameter relating to the tested substrate based on a measure of feature asymmetry in the at least first features of the tested substrate and further based on a relationship determined for a plurality of corresponding at least first features of at least one further substrate representative of the tested substrate, the relationship being between a measure of quality of an estimate of the parameter relating to the at least one further substrate and a measure of feature asymmetry in the corresponding first features,
  wherein the emitted radiation is diffracted by the first features and by second features, the first feature having a positive overlay bias and the second feature having a negative overlay bias and the relationship is determined for a plurality of pairs of corresponding first and second features on the at least one further substrate, and
  wherein the processor is further configured to disregard the estimate of the parameter on the tested substrate if a magnitude of the measure of feature asymmetry in the at least first features of the tested substrate exceeds a threshold value that is based on the relationship determined for the corresponding at least first features of at least one further substrate.

3. The apparatus according to claim 2, wherein the estimation is based on radiation emitted by the optical system at a plurality of wavelengths.

4. The apparatus according to claim 2, wherein the measure of feature asymmetry comprises an intercept term of the regression analysis data.

5. The apparatus according to claim 2, wherein:
  the measure of quality of the estimate of the parameter for the at least one further substrate comprises a goodness of fit of corresponding regression analysis data for the at least one further substrate and, the corresponding regression analysis for the further substrate has been determined using radiation emitted and diffracted from the plurality of corresponding at least first features of the at least one further substrate at a number of wavelengths greater than the one or more wavelengths emitted by the optical system.

6. The apparatus according to claim 2, wherein the measure of feature asymmetry in the at least first features and the corresponding first features is determined by a distance-to-origin (DTO) value.

7. The apparatus according to claim 2, wherein the at least first features form part of a metrology target.

8. The apparatus according to claim 2, wherein the optical system is configured to emit radiation at wavelengths in ranges from: 400 nm to 900 nm; 0.1 nm to 100 nm; and/or 10 nm to 20 nm.

9. The apparatus according to claim 2, wherein the processor is further configured, based on radiation emitted by the optical system at three or more wavelengths and diffracted from the plurality of corresponding at least first features of the further substrate, to:

determine further substrate asymmetry intensity data for the plurality of corresponding at least first features relating to the further substrate;

based on the determined further substrate asymmetry intensity data, determine the measure of quality of the estimate of the parameter relating to the at least one further substrate and the measure of feature asymmetry relating to the further substrate; and determine the relationship between the measure of quality of the estimate of the parameter relating to the at least one further substrate and the measure of feature asymmetry in the plurality of corresponding at least first features.

10. The apparatus according to claim 9, wherein the processor is further configured to determine the measure of quality of the estimate of the parameter relating to the at least one further substrate by undertaking a regression analysis on the further substrate asymmetry intensity data.

11. The apparatus according to claim 10, wherein the measure of quality of the estimate of the parameter relating to the at least one further substrate comprises a goodness of fit of the regression analysis.

12. The apparatus according to claim 9, wherein the processor is further configured to determine the measure of feature asymmetry in the plurality of corresponding at least first features based on the determined further substrate asymmetry intensity data and the measure of feature asymmetry in the plurality of corresponding at least first features comprises an intercept term of the regression analysis.

13. An inspection apparatus comprising the apparatus of claim 2.

14. The inspection apparatus of claim 13, wherein the inspection apparatus is a metrology apparatus.

15. A lithographic cell comprising an apparatus of claim 2.

16. An apparatus for determining a relationship between a measure of quality of an estimate of a parameter of a lithographic process and a measure of feature asymmetry in a plurality of at least first features of at least one example substrate, based on radiation emitted by an optical system at one or more wavelengths and diffracted from the plurality of at least first features of the example substrate, the apparatus comprising a processor configured to:

determine asymmetry intensity data for the plurality of at least first features relating to the at least one example substrate based on the diffracted radiation;

based on the determined asymmetry intensity data, determine the measure of quality of the estimate of the parameter relating to the at least one example substrate and the measure of feature asymmetry relating to a further substrate; and determine the relationship between the measure of quality of the estimate of the parameter relating to the at least one example substrate and the measure of feature asymmetry in the plurality of at least first features, wherein the measure of feature asymmetry in the plurality of at least first features is determined by a distance-to-origin (DTO) value, and wherein the processor is further configured to reject the estimate of the parameter on the at least one example substrate if a magnitude of the DTO value in the at least first features of the at least one example substrate exceeds a threshold value that is based on a goodness of fit of a regression analysis of determined asymmetry intensity data on the further substrate.

17. A method for estimating a parameter of a lithographic process that has been undertaken on a tested substrate, the estimation being based on regression analysis data that has been determined by a regression analysis of asymmetry intensity data that has, in turn, been determined using radiation emitted by an optical system at one or more wavelengths and diffracted by at least first features of the tested substrate, the method comprising:

determining a quality of the estimate of the parameter relating to the tested substrate based on a measure of feature asymmetry in the at least first features of the tested substrate and further based on a relationship determined for a plurality of corresponding at least first features of at least one further substrate representative of the tested substrate, the relationship being between a measure of quality of an estimate of the parameter relating to the at least one further substrate and a measure of feature asymmetry in the corresponding first features; and disregarding the estimate of the parameter on the tested substrate if a magnitude of the measure of feature asymmetry in the at least first features of the tested substrate exceeds a threshold value that is based on the relationship determined for the corresponding at least first features of at least one further substrate.

18. A method for determining a relationship between a measure of quality of an estimate of a parameter of a lithographic process and a measure of feature asymmetry in a plurality of at least first features of at least one example substrate, based on radiation emitted by an optical system at one or more wavelengths and diffracted from the plurality of at least first features of the example substrate, the method comprising:

determining asymmetry intensity data for the plurality of at least first features relating to the at least one example substrate based on the diffracted radiation;

based on the determined asymmetry intensity data, determining the measure of quality of the estimate of the parameter relating to the at least one example substrate and the measure of feature asymmetry relating to a further substrate; and determining the relationship between the measure of quality of the estimate of the parameter relating to the at least one example substrate and the measure of feature asymmetry in the plurality of at least first features wherein the measure of feature asymmetry in the plurality of at least first features is determined by a distance-to-origin (DTO) value, and wherein the processor is further configured to reject the estimate of the parameter on the at least one example substrate if a magnitude of the DTO value in the at least first features of the at least one example substrate exceeds a threshold value that is based on a goodness of fit of a regression analysis of determined asymmetry intensity data on the further substrate.

19. A computer program comprising instructions which, when executed on at least one processor, cause the at least one processor to control an apparatus to carry out a method for estimating a parameter of a lithographic process that has been undertaken on a tested substrate, the estimation being based on regression analysis data that has been determined by a regression analysis of asymmetry intensity data that has, in turn, been determined using radiation emitted by an optical system at one or more wavelengths and diffracted by at least first features of the tested substrate, the method comprising:

determining a quality of the estimate of the parameter relating to the tested substrate based on a measure of feature asymmetry in the at least first features of the tested substrate and further based on a relationship determined for a plurality of corresponding at least first features of at least one further substrate representative of the tested substrate, the relationship being between a measure of quality of an estimate of the parameter relating to the at least one further substrate and a measure of feature asymmetry in the corresponding first features; and disregarding the estimate of the parameter on the tested substrate if a magnitude of the measure of feature asymmetry in the at least first features of the tested substrate exceeds a threshold value that is based on the relationship determined for the corresponding at least first features of at least one further substrate.

* * * * *